United States Patent [19]
Shigeta et al.

[11] Patent Number: 5,812,381
[45] Date of Patent: Sep. 22, 1998

[54] LEAD FRAME AND INTEGRATED CIRCUIT PACKAGE USING THE LEAD FRAME

[75] Inventors: Hiroyuki Shigeta; Mutsumi Nagano, both of Kanagawa, Japan

[73] Assignee: Sony Corporation, Tokyo, Japan

[21] Appl. No.: 694,214

[22] Filed: Aug. 8, 1996

[30] Foreign Application Priority Data

Aug. 8, 1995 [JP] Japan .................................. 7-201948

[51] Int. Cl.⁶ .................................................. H05K 7/02
[52] U.S. Cl. ..................... 361/813; 361/820; 361/772; 361/773; 361/783; 257/666; 257/667; 257/672; 257/676; 257/688; 257/690; 257/692; 257/701; 257/707; 257/711
[58] Field of Search ................................ 361/813, 820, 361/772, 773, 777, 783; 257/666, 667, 672, 676, 671, 677, 688, 690, 692, 701, 735, 707, 708, 711

[56] References Cited

U.S. PATENT DOCUMENTS

| | | | |
|---|---|---|---|
| 5,424,577 | 6/1995 | Suzuki et al. | 257/666 |
| 5,468,991 | 11/1995 | Lee et al. | 257/666 |
| 5,637,914 | 6/1997 | Tanaka et al. | 257/666 |

*Primary Examiner*—Leo P. Picard
*Assistant Examiner*—David Foster
*Attorney, Agent, or Firm*—Hill & Simpson

[57] ABSTRACT

A lead frame includes a base member having a device hole for accommodating a semiconductor chip therein, a plurality of inner lead portions extended outward from respective sides of the device hole, outer lead portions electrically connected to the inner lead portions, respectively, an adhesion area to which the inner lead portions formed on the base member are adhered, and a plurality of dummy leads disposed on a portion of the adhesion area where a density of the inner lead portions is low.

17 Claims, 4 Drawing Sheets

LEAD FRAME AND INTEGRATED CIRCUIT PACKAGE USING THE LEAD FRAME

BACKGROUND OF THE INVENTION

1. Field of the Invention

The present invention generally relates to a lead frame and an integrated circuit package using the lead frame and, more particularly, is directed to a lead frame which mounts a chip-shaped semiconductor element thereon to perform an electrical input and an output with an external portion.

2. Description of the Prior Art

A lead frame, electrically connected to a chip-shaped semiconductor element so as to perform electrical signal input and output with an external portion, is provided with a plurality of inner lead portions and a plurality of outer lead portions in corresponding to a plurality of electrode pads provided on the semiconductor element.

FIGS. 1A and 1B are schematic plan views used for explaining a lead frame. As shown by FIG. 1A illustrating an entire configuration of the lead frame, a lead frame 1' includes a device hole 2 of a substantially square-shape on which a chip-shaped semiconductor element (not shown) is mainly disposed, a plurality of inner lead portions 3 extended outward from the respective sides of the device hole 2, outer lead portions 4 electrically connected to the inner lead portions 3, respectively, and a protection tape 5 for holding the inner lead portions 3 at the outer periphery portion of the device hole 2.

In order to connect the semiconductor element to such a lead frame 1', the electrode pads of the semiconductor element are connected to the inner lead portions 3, respectively, by using thermal pressing, for example, in a state where the semiconductor element is overlapped on the device hole 2 so as to be matched therewith. At the time of connecting the electrode pads and the inner lead portions, it is important that the interval of the electrode pads of the semiconductor element accurately coincides with that of the inner lead portions 3. In this respect, the inner lead portions 3 are protected by the protection tape 5 so that the inner lead portions 3 are not bent or broken by any external force.

This protection tape 5 is formed by depositing adhesive 51 on a base member such as a polyimide film, for example. The protection film 5 is attached to the lead frame when a metal lead frame material is etched to form the lead frame 1'.

However, such a lead frame has the following problem. That is, when attaching the protection tape 5 shown in FIGS. 1A and 1B to the outer periphery portion of the device hole 2, the adhesive 51 deposited on the protection tape 5 is not sufficiently filled at the periphery of the inner lead portion 3, in particular, at the outside of the corner portion of the device hole 2 where the inner lead portions 3 are disposed with a low density. As a result, there arises a problem that non-filled portions A of the adhesive 51 exist at the outside of the corner portion of the device hole 2.

More specifically, as clear from an enlarged diagram of the lead frame shown in FIG. 1B, a gap area where the inner lead portions 3 are not disposed is large at the outside of the corner portion of the device hole 2. Accordingly, when attaching the protection tape 5 on the inner lead portions 3 with a predetermined pressure, the adhesive 51 is less filled around the inner lead portions 3 at the outside of the corner portion of the device hole 2 as compared with other portions where the inner lead portions 3 are disposed with a high density. As a result, the aforesaid adhesive non-filled portions A appear at the outside of the corner portion.

Thus, the contact property between the inner lead portions 3 and the protection tape 5 degrades at the inner lead portions 3 adjacent to the adhesive non-filled portions A. Consequently, since the adhesion force of the protection tape 5 for supporting the inner lead portions 3 is reduced near the adhesive non-filled portions A, lift-up, bend or the like of the inner lead portions 3 may occur. As a result, when connecting the inner lead portions 3 to the electrode pads of the semiconductor element, the pressure of the inner lead portions to the electrode pads may be insufficient and the inner lead portions 3 may be positionally deviated from the electrode pads, so that the connection property between the inner lead portions 3 and the electrode pads of the semiconductor element may be degraded.

OBJECTS AND SUMMARY OF THE INVENTION

Therefore, it is an object of the present invention to provide an improved lead frame and an improved integrated circuit package in which the aforesaid shortcomings and disadvantages encountered with the conventional lead frame can be eliminated.

It is another object of the present invention to provide an improved lead frame and an improved integrated circuit package in which the inner lead portions can be accurately aligned to the electrode pads of the semiconductor element and further the inner lead portions can be uniformly pressed to the electrode pads.

As an aspect of the present invention, there is provided a lead frame which includes a base member having a device hole for accommodating a semiconductor chip therein, a plurality of inner lead portions extended outward from respective sides of the device hole, outer lead portions electrically connected to the inner lead portions, respectively, an adhesion area, to which the inner lead portions formed on the base member are adhered, and a plurality of dummy leads disposed on a portion of the adhesion area where a density of the inner lead portions is low.

As another aspect of the present invention, there is provided with an integrated circuit package including a semiconductor chip and a lead frame mounting the semiconductor chip thereon, wherein the lead frame includes a base member having a device hole for accommodating the semiconductor chip therein, a plurality of inner lead portions extended outward from respective sides of the device hole, outer lead portions electrically connected to the inner lead portions, respectively, an adhesion area to which the inner lead portions formed on the base member are adhered, and a plurality of dummy leads disposed on a portion the adhesion area where a density of the inner lead portions is low.

According to the present invention, when attaching the protection tape to the outer portion of the device hole, since the dummy leads are provided at the portion where the inner lead portions are disposed with a low density, an area to be filled with the adhesive is reduced or limited and hence the adhesive can fill that area similar to the area where the inner lead portions are provided at high density.

DETAILED DESCRIPTION OF THE PREFERRED EMBODIMENTS

A lead frame and an integrated circuit package using the lead frame according to an embodiment of the present invention will be described with reference to FIGS. 2 and 3.

Figure 1A:
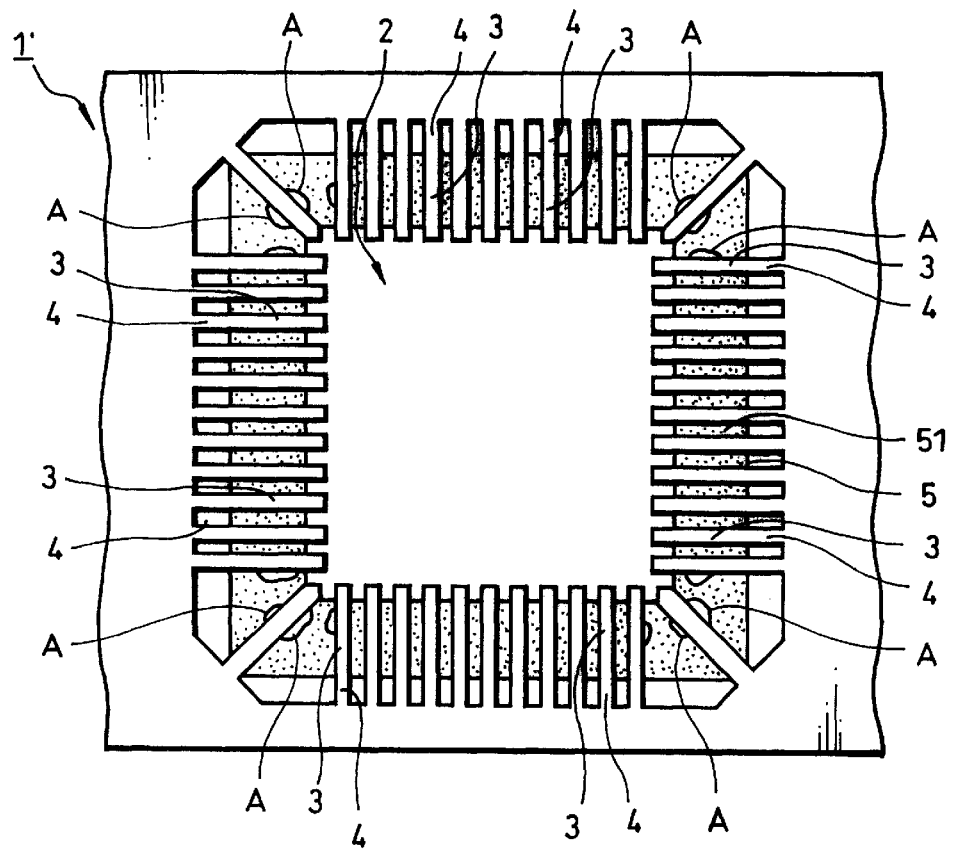
FIG. 1A is a schematic plan view illustrating an entire configuration of an example of a lead frame.
Figure 1B:
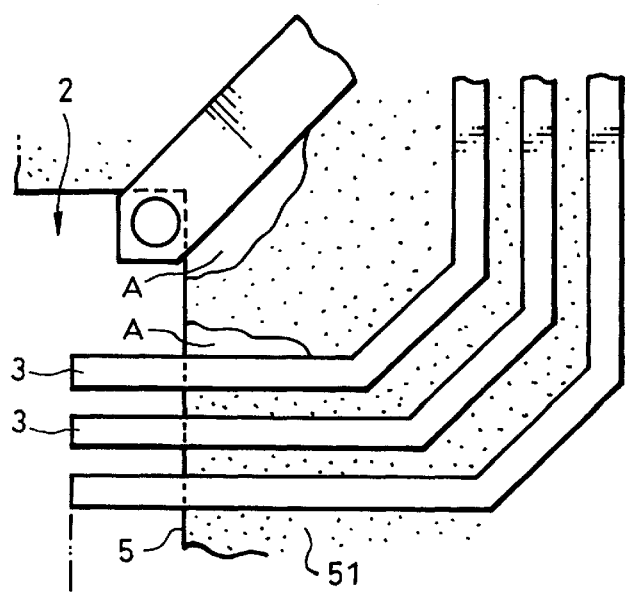
FIG. 1B is an enlarged plan view illustrating the corner portion of the device hole of the lead frame shown in FIG. 1A.
Figure 2:
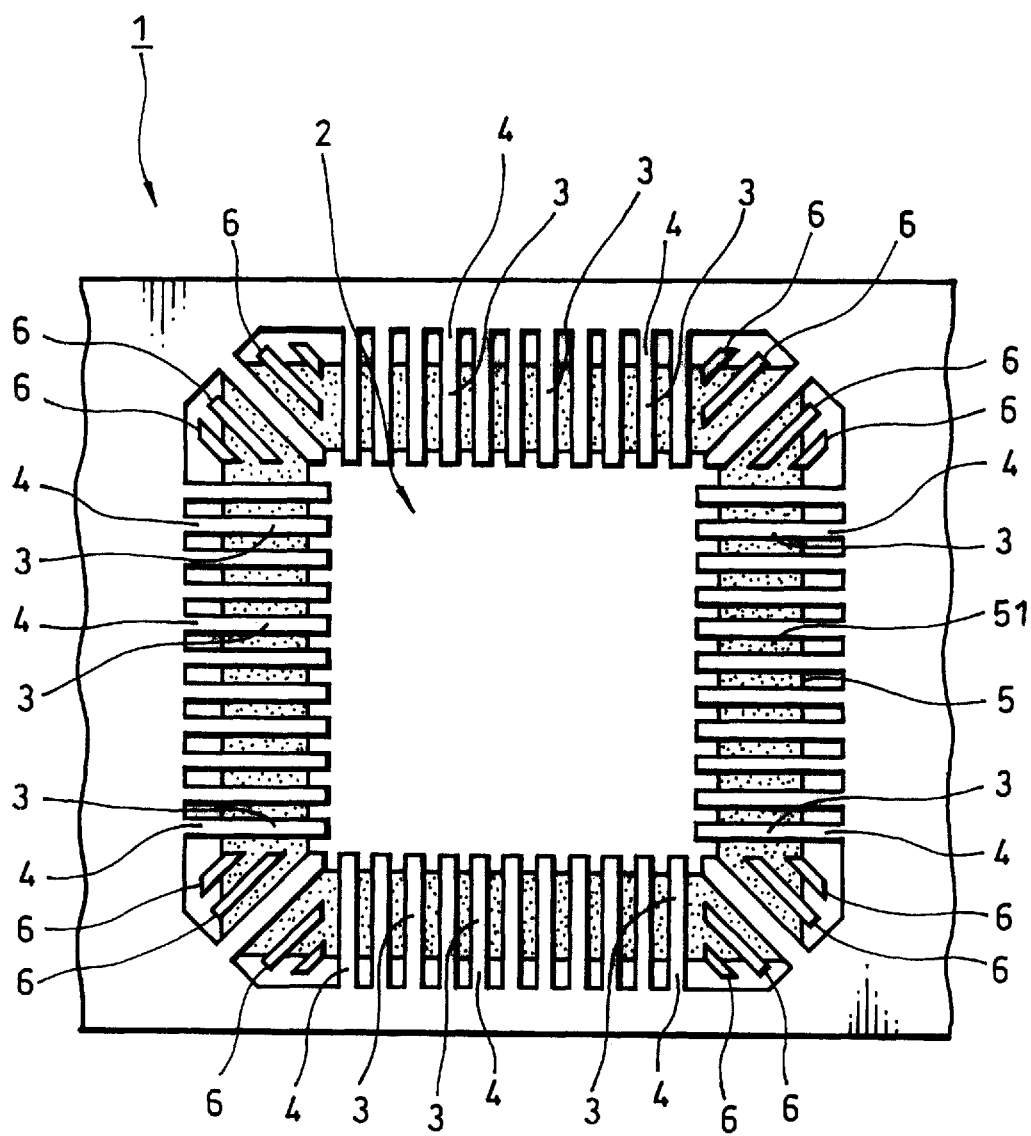
FIG. 2 is a schematic plan view illustrating an entire configuration of a lead frame according to an embodiment of the present invention.

FIG. 2 is a schematic plan view illustrating an entire configuration of a lead frame according to the embodiment of the present invention. FIG. 3 is an enlarged plan view illustrating the corner portion of the device hole of the lead frame according to the embodiment.

As shown in FIG. 2, a lead frame 1 of the embodiment includes a plurality of inner lead portions 3 extended outward from the respective sides of a device hole 2 of a substantially square-shape, which is formed through a base member outer lead portions 4 electrically connected to the inner lead portions 3, respectively, and a protection tape 5 adhered to the inner lead portions 3 for holding the inner lead portions 3 at the outer periphery portion of the device hole 2. Further, in areas of the base member where the protection tape 5 is adhered at the outside of the corner portions of the device hole 2 and at portions where the density of the inner lead portions 3 is low, the lead frame 1 is provided with dummy leads 6 which are disposed with a predetermined interval.

The protection tape 5 holds the respective inner lead portions 3 in a state that the protection tape 5 surrounds the outer periphery portion of the device hole 2. Further, the protection tape 5 is pasted on the dummy leads 6 to hold them. In the lead frame 1 of the embodiment, when the protection tape 5 is pasted through the adhesive 51, the protection tape 5 is adhered in a manner that the inner lead portions 3 and the dummy leads 6 are tied through the protection tape with reference to the outer periphery of the device hole 2, for example.

In this case, the protection tape 5 is pressed to the inner lead portions 3 by using a predetermined jig (not shown), whereby the adhesive 51 is filled in the gaps between the respective adjacent inner lead portions 3. Further, since the lead frame 1 of the embodiment includes the dummy leads 6 at the low density portions of the inner lead portions 3 in the outside of the corner portions of the device hole 2, the adhesive 51 is also filled in the gaps among the respective adjacent dummy leads 6.

In other words, the dummy leads 6 provided at the low density portions of the inner lead portions 3 limit the area to be filled with the adhesive 51 at the low density portions of the inner lead portions 3, so that the adhesive 51 can be filled in the area similar to the high density portions of the inner lead portions 3. In this manner, the adhesive 51 can be filled in the low density portions of the inner lead portions 3 without causing the adhesive non-filled portion.

Figure 3:
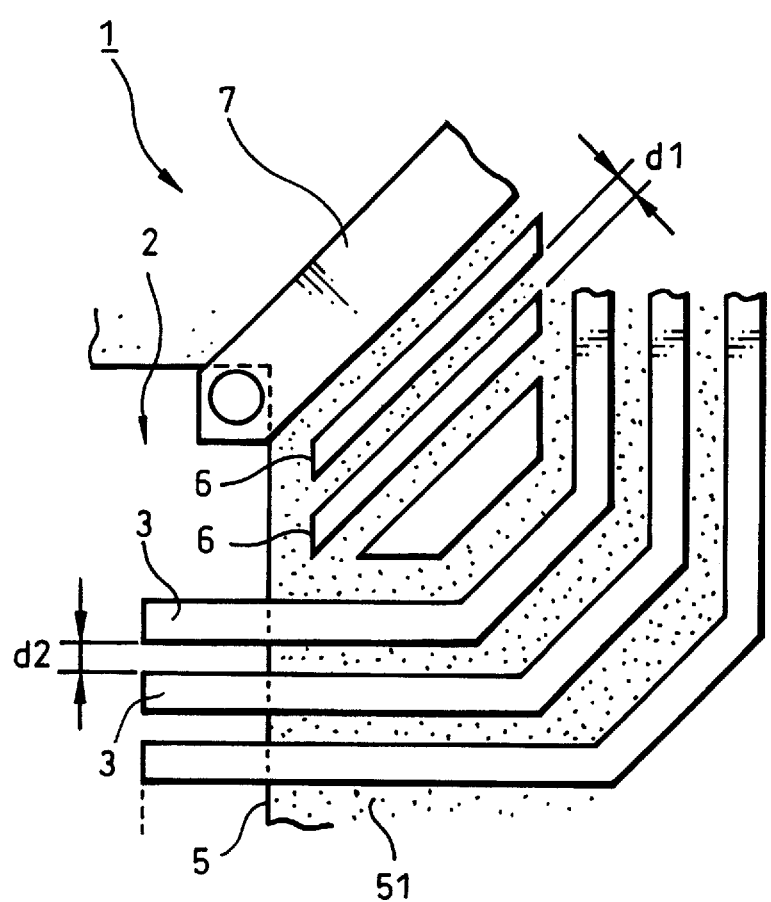
FIG. 3 is an enlarged plan view illustrating the corner portion of the device hole of the lead frame shown in FIG. 2.

As shown in FIG. 3, the lead frame 1 according to the embodiment is designed such that the interval d1 of the dummy leads 6 is substantially same as the interval d2 of the inner lead portions 3. Further, although not shown, the dummy leads 6 are disposed at the both sides of an alignment lead 7 which is arranged at the corner portion of the device hole 2 with respect to the alignment lead 7. Accordingly, the gap size in the low density portions of the inner lead portions 3 can be set substantially same as that in the high density portions of the inner lead portions 3, so that the adhesive 51 can be filled uniformly on the entire adhesion area of the protection tape 5.

Figure 4A:
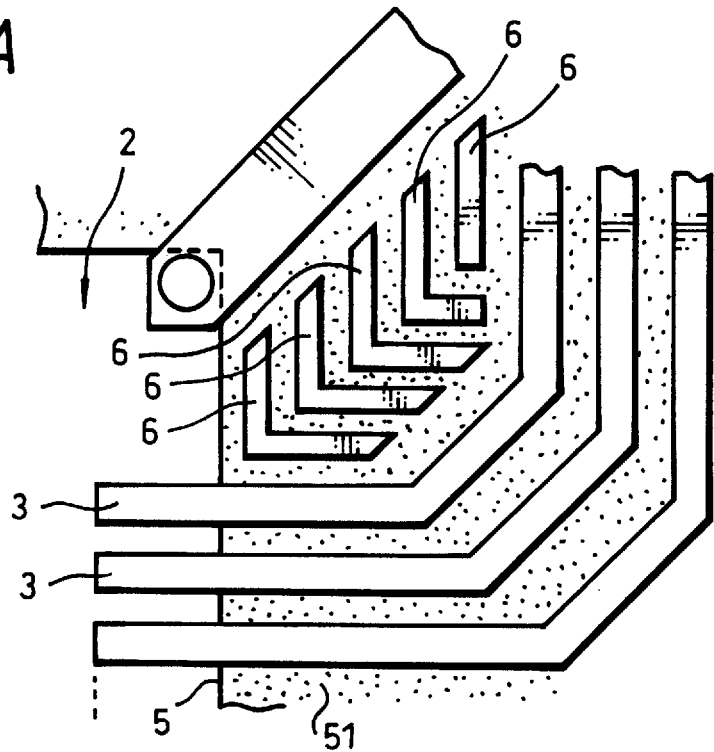
FIG. 4A is an enlarged plan view illustrating the corner portion of the device hole of the lead frame according to another embodiment of the present invention.
Figure 4B:
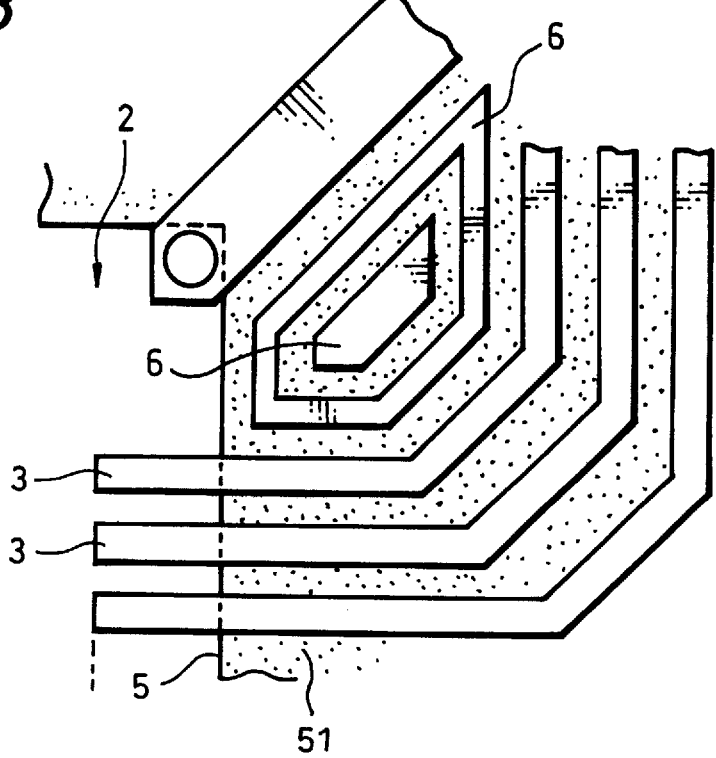
FIG. 4B is an enlarged plan view illustrating the corner portion of the device hole of the lead frame according to still another embodiment of the present invention.

FIGS. 4A and 4B are enlarged plan views illustrating the corner portions of the device holes of the lead frames according to other embodiments of the present invention. In the embodiment shown in FIG. 4A, a plurality of dummy leads 6 of a substantially L-shape are provided with a predetermined interval at the low density portion of the inner lead portions 3 in the outside of the corner portion of the device hole 2. While, in the embodiment shown in FIG. 4B, dummy leads 6 of a loop-shape are provided at the low density portion of the inner lead portions 3 in the outside of the corner portion of the device hole 2.

In each of the embodiments of FIGS. 4A and 4B, the interval of the dummy leads 6 is preferably set to be substantially same as that of the inner lead portions 3. In this manner, the area to be filled with the adhesive 51 is limited or reduced at the low density portions of the inner lead portions 3 by the provision of the dummy leads 6, so that the adhesive 51 can be filled at the area in the low density portions of the inner lead portions 3 like the high density portions of the inner lead portions 3.

As described above, although various shapes of the dummy leads 6 may be thought of, the shape of the dummy lead 6 is set suitably on the basis of the filling property of the adhesive 51 in view of the viscosity thereof or the like as well as the size and shape of the low density portion of the inner leads 3. The dummy lead 6 may be shaped so as to be used as an alignment mark for a chip-shaped semiconductor element (not shown) to be disposed in the device hole 2.

While in the aforesaid embodiments, the dummy leads 6 are provided at the low density portion of the inner lead portions 3 in the outside of the corner portion of the device hole 2, the dummy leads 6 may be provided at the low density portion of the inner lead portions 3 other than the outside of the corner portion of the device hole 2. According to the provision of such dummy leads, the adhesive 51 can be filled uniformly on the entire area of the protection tape 5. As a consequence, since the adhesive non-filled area is prevented from being caused, the protection tape 5 can be adhered surely to the inner lead portions entirely.

As described above, the lead frame according to the present invention exhibits the following technical advantages. That is, since the adhesive can be filled uniformly without causing any adhesive non-filled area when adhering the protection tape to the inner lead portions, the protection tape can be adhered surely to all of the inner lead portions, so that lift-up, bend or the like of the inner lead portions can be surely prevented. As a consequence, since the inner lead portions can be accurately aligned to the electrode pads of the semiconductor element and further the inner lead portions can be uniformly pressed to the electrode pads, a semiconductor device with high reliability can be provided.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A lead frame comprising:
   a base member having a device hole for accommodating a semiconductor chip therein;
   a plurality of inner lead portions extending from respective sides of said device hole;
   an adhesion area to which said inner lead portions formed on said base member are adhered; and
   a plurality of dummy leads provided on a portion of said adhesion area where a density of said inner lead portions is low.

2. A lead frame according to claim 1, wherein said plurality of dummy leads are disposed with a predetermined interval.

3. A lead frame according to claim 1, wherein an arranging interval of said plurality of dummy leads is substantially same as an interval of said plurality of inner lead portions.

4. A lead frame according to claim 1, wherein said device hole is formed to be a substantially rectangular shape, and said dummy leads are disposed at a corner portion of said device hole.

5. A lead frame according to claim 1, wherein said plurality of dummy leads are formed to be a substantially L-shape.

6. A lead frame according to claim 1, wherein said plurality of dummy leads are formed to be a loop-shape.

7. A lead frame according to claim 1, wherein said base member is a polyimide film.

8. An integrated circuit package comprising:
   a semiconductor chip; and
   a base member having a device hole for accommodating said semiconductor chip therein;
   a plurality of inner lead portions extending outward from respective sides of said device hole,
   an adhesion area to which said inner lead portions formed on said base member are adhered, and
   a plurality of dummy leads provided on a portions of said adhesion area where a density of said inner lead portions is low.

9. An integrated circuit according to claim 8, wherein said plurality of dummy leads are disposed with a predetermined interval.

10. An integrated circuit according to claim 8, wherein an arranging interval of said plurality of dummy leads is substantially same as an arranging interval of said plurality of inner lead portions.

11. An integrated circuit according to claim 8, wherein said device hole is formed to be a substantially rectangular shape, and said dummy leads are disposed at a corner portion of said device hole.

12. An integrated circuit according to claim 8, wherein said plurality of dummy leads are formed to be a substantially L-shape.

13. An integrated circuit according to claim 8, wherein said plurality of dummy leads are formed to be a loop-shape.

14. An integrated circuit according to claim 8, wherein said base member is a polyimide film.

15. A lead frame according to claim 1, wherein the plurality of dummy leads have a spacing which is substantially the same as a spacing between the inner lead portions and further wherein the plurality of dummy leads substantially cover at least a corner area.

16. An integrated circuit package according to claim 8, wherein the plurality of dummy leads have a spacing which is substantially the same as a spacing between the inner lead portions and further wherein the plurality of dummy leads substantially cover at least a corner area.

17. A method of forming an integrated circuit package comprising the steps of:
   providing a base member having a device hole for a semiconductor chip;
   providing a plurality of inner lead portions extending outward from respective sides of said device hole;
   forming a plurality of dummy leads on a portion of an adhesion area where a density of said lead portions is low and further wherein the dummy leads are spaced at a substantially a same interval as an interval of the plurality of inner leads and wherein the dummy leads substantially cover a corner area of the adhesion area.

* * * * *